(12) United States Patent
Keshavarzi et al.

(10) Patent No.: US 7,110,278 B2
(45) Date of Patent: Sep. 19, 2006

(54) CROSSPOINT MEMORY ARRAY UTILIZING ONE TIME PROGRAMMABLE ANTIFUSE CELLS

(75) Inventors: Ali Keshavarzi, Portland, OR (US); Fabrice Paillet, Hillsboro, OR (US); Muhammad M. Khellah, Lake Oswego, OR (US); Dinesh Somasekhar, Portland, OR (US); Yibin Ye, Portland, OR (US); Stephen H. Tang, Beaverton, OR (US); Mohsen Alavi, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 191 days.

(21) Appl. No.: 10/954,537

(22) Filed: Sep. 29, 2004

(65) Prior Publication Data

US 2006/0067152 A1 Mar. 30, 2006

(51) Int. Cl.
*G11C 17/08* (2006.01)
(52) U.S. Cl. ............... 365/104; 365/96; 365/103; 327/525; 257/530
(58) Field of Classification Search ............... None
See application file for complete search history.

(56) References Cited

U.S. PATENT DOCUMENTS

| | | | | |
|---|---|---|---|---|
| 5,291,434 A * | 3/1994 | Kowalski | ............... | 365/185.04 |
| 5,742,555 A * | 4/1998 | Marr et al. | ............... | 365/225.7 |
| 5,789,796 A | 8/1998 | Kang et al. | | |
| 5,798,552 A | 8/1998 | Alavi et al. | | |
| 5,909,049 A * | 6/1999 | McCollum | ............... | 257/530 |
| 5,949,250 A * | 9/1999 | Schmidt et al. | ............... | 326/38 |
| 6,172,401 B1 | 1/2001 | Brand | | |
| 6,181,608 B1 | 1/2001 | Keshavarzi et al. | | |
| 6,201,428 B1 | 3/2001 | Clark | | |
| 6,243,294 B1 * | 6/2001 | Rao et al. | ............... | 365/185.14 |
| 6,407,591 B1 | 6/2002 | Wong et al. | | |
| 6,417,720 B1 | 7/2002 | Denham | | |
| 6,515,344 B1 | 2/2003 | Wollesen | | |
| 6,519,176 B1 | 2/2003 | Hamzaoglu et al. | | |
| 6,580,145 B1 | 6/2003 | Wu et al. | | |
| 6,584,029 B1 | 6/2003 | Tran et al. | | |
| 6,599,796 B1 | 7/2003 | Mei et al. | | |
| 6,710,640 B1 * | 3/2004 | Kothandaraman et al. | .. | 327/525 |
| 6,822,888 B1 * | 11/2004 | Peng | ............... | 365/63 |
| 6,836,000 B1 * | 12/2004 | Marr et al. | ............... | 257/530 |
| 7,002,842 B1 * | 2/2006 | Tang et al. | ............... | 365/177 |
| 7,030,458 B1 * | 4/2006 | Marr | ............... | 257/530 |
| 7,031,203 B1 * | 4/2006 | Tang et al. | ............... | 365/189.09 |
| 2005/0169055 A1 * | 8/2005 | Lung | ............... | 365/185.17 |

* cited by examiner

*Primary Examiner*—Son Mai
(74) *Attorney, Agent, or Firm*—Schwabe, Williamson & Wyatt, P.C.

(57) ABSTRACT

Crosspoint memory arrays utilizing one time programmable antifuse cells are disclosed.

21 Claims, 4 Drawing Sheets

CROSSPOINT MEMORY ARRAY UTILIZING ONE TIME PROGRAMMABLE ANTIFUSE CELLS

FIELD OF INVENTION

Embodiments of the present invention are generally directed to the field of integrated circuits, and more specifically, to crosspoint memory arrays.

BACKGROUND INFORMATION

One time programmable (OTP) memory generally represents a class of memory that, during normal use, may be programmed only once. Although different techniques have been used in the past to implement OTP memory arrays, the techniques typically rely on information being stored on the insulated gate of a metal oxide semiconductor (MOS) transistor. As deep sub-micron technologies featuring very thin gate oxides become more prevalent, however, these implementations tend to result in high gate leakage current preventing long retention time of the information.

OTP memory arrays often utilize polysilicon fuse elements that are programmed by allowing a high current to flow through the fuse elements causing the fuse element to "thermally blow". Application of such high voltage and high current typically required to thermally blow a polysilicon fuse, however, may cause other circuit elements to be damaged. Accordingly, many such OTP memories require large protection devices that are designed to carry the programming current (typically around 100 mA), while at the same time isolating current sensitive devices from the large programming current. Unfortunately, the use of these protection devices typically causes such fuse elements to occupy a very large silicon area (typically greater than 1000 µm$^2$).

Additionally, the blowing of a polysilicon fuse is an unreliable process that does not act cumulatively. That is, if a fuse does not blow correctly upon application of a programming current, it cannot be further blown by applying the programming current again. Consequently, a certain level of redundancy is typically required to compensate for the small number of fuse elements that do not blow correctly on the first try. However, this redundancy requires further amounts of the scarce silicon area.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION

Figure 1:
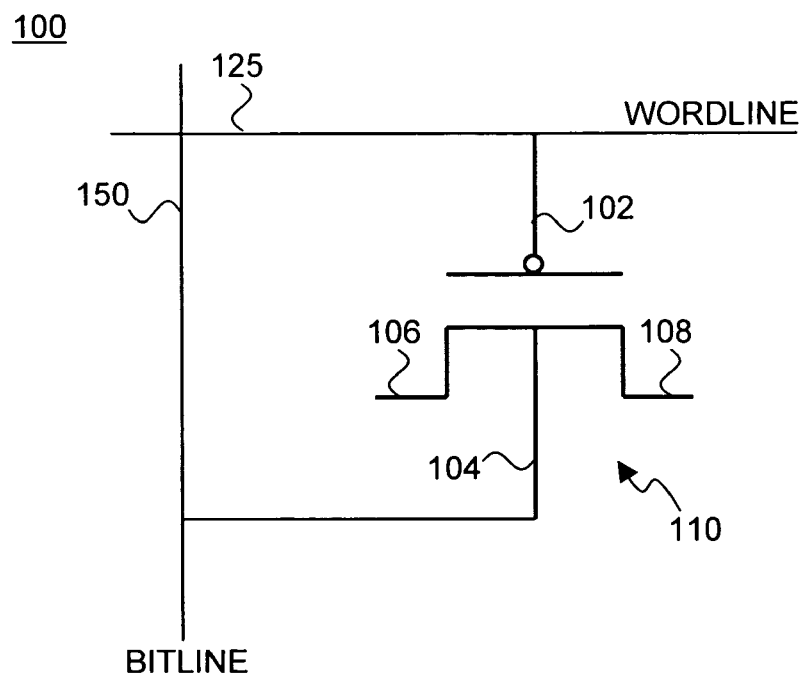
FIG. 1 illustrates a representative crosspoint memory cell in accordance with one embodiment of the invention.

Illustrative embodiments of the present invention include, but are not limited to the use of thin gate oxide based antifuse elements within a dense one time programmable crosspoint memory array.

Various aspects of the illustrative embodiments will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials, and configurations are set forth in order to provide a thorough understanding of the illustrative embodiments. However, it will be apparent to one skilled in the art that embodiments of the present invention may be practiced without the specific details. In other instances, well-known features are omitted or simplified in order not to obscure the illustrative embodiments.

Although various discrete operations will be described herein, the mere order of description should not be construed as to imply that these operations are necessarily performed in the order they are presented.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment or invention. Furthermore, the particular features, structures, or characteristics may be combined in any suitable manner in one or more embodiments. Lastly, the terms "comprising", "including", "having", and the like, as used in the present application, are intended to be synonymous, unless the context dictates otherwise.

Crosspoint memory arrays may be defined by memory cells formed between the intersection or crosspoint of row conductors (also referred to as "word lines") that extend along rows of the crosspoint array, and column conductors (also referred to as "bit lines") that extend along columns of the crosspoint array. In one embodiment of the invention, at least one memory cell of a crosspoint memory array may be formed from a single memory cell element coupled between a row conductor and column conductor. In one embodiment, at least one memory cell of a crosspoint memory array may include a single metal oxide semiconductor field effect transistor (MOSFET) device having a gate terminal coupled directly to a row conductor, a body terminal coupled directly to a column conductor, and corresponding source and drain terminals left unconnected or 'floating'.

In one embodiment, one or more of the crosspoint memory cell elements may be equipped with a thin gate oxide layer, which due at least in part to the source and drain terminals of the memory cell devices being floated, may be forced to advantageously breakdown or "blow" within the channel region of the memory cell element upon application of a relatively low (e.g., 2 to 3 times supply voltage) voltage differential between the gate and body terminal of the memory cell device. This in turn may effectively cause a PN diode to be formed in the channel region of the device between the gate and body as oppositely charged dopant atoms diffuse from the gate region towards the body. Thus, in accordance with one embodiment of the invention, crosspoint memory cell elements may function as antifuse elements, which behave as open circuits when a corresponding memory cell has not been programmed, and behave as short circuits when the corresponding memory cell has been programmed through application of a sufficient programming voltage differential. Due at least in part to the significant difference in resistivity (e.g., around 3 to 4 orders of magnitude) between an antifuse element having a blown or broken-down Oxide layer and an antifuse element having an Oxide layer that is intact, the programming state of the respective memory cells may be sensed accordingly.

In contrast, conventional crosspoint memory cell arrays typically utilize polysilicon fuse elements that normally appear as short circuits and only appear as open circuits once the respective devices have been blown. These fuse elements typically have a gate made from a polysilicon layer and often have their body, source and drain terminals grounded together.

FIG. 1 illustrates a representative crosspoint memory cell in accordance with one embodiment of the invention. As shown, memory cell 100 includes antifuse element 110 coupled between wordline 125 and bitline 150. In one embodiment, antifuse element 110 represents a field effect transistor and includes gate terminal 102, body terminal 104, source/drain terminal 106, and source/drain terminal 108. In the illustrated embodiment, gate terminal 102 is coupled to wordline 125, body terminal 104 is coupled to bitline 150, and source/drain terminal 106 and source/drain terminal 108 are each left to float.

Source/drain terminals refer to the terminals of a field effect transistor (FET), between which conduction occurs under the influence of an electric field, subsequent to the inversion of the semiconductor surface under the influence of an electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals. Designers may designate a particular source/drain terminal to be a "source" or a "drain" on the basis of the voltage to be applied to that terminal when the FET is operated in a circuit. However, since according to one embodiment of the invention, the source/drain terminals 106 and 108 are left to float, the interchangeable source/drain nomenclature is used herein.

Figure 2:
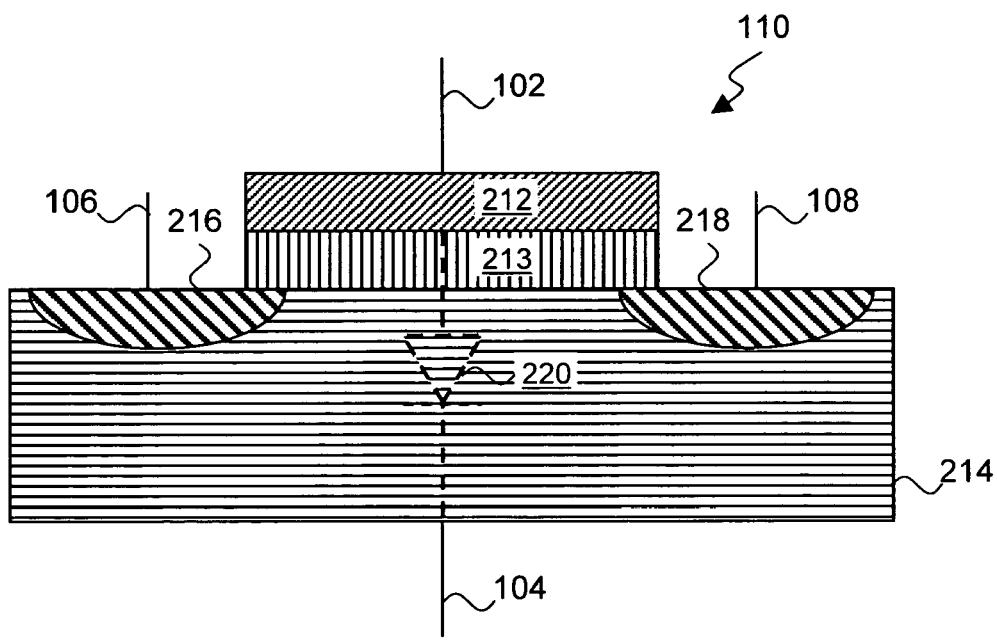
FIG. 2 illustrates an example cross-sectional view of antifuse element 110 in accordance with one embodiment.

FIG. 2 illustrates an example cross-sectional view of antifuse element 110 in accordance with one embodiment. In the illustrated embodiment, antifuse element 110 represents a P-channel MOSFET (PMOS) device having a P-type substrate (e.g. body) 214, N-type source/drain regions 216 and 218, Oxide layer 213, and metalized gate layer 212. In one embodiment, Oxide layer 213 may be composed of silicon dioxide (SiO2), however other dielectrics such as, but not limited to Zr02 and Hf02 may similarly be used. In accordance with one embodiment of the invention, a PN junction, represented as diode 220, may be effectively formed within the channel region of antifuse element 110 between gate layer 212 and P-type substrate 214. In one embodiment, antifuse element 110 may be implemented via Complementary Metal Oxide Semiconductor (CMOS) technology having one or more isolated shared N-wells, each coupled to a respective bitline 150.

Figure 3:
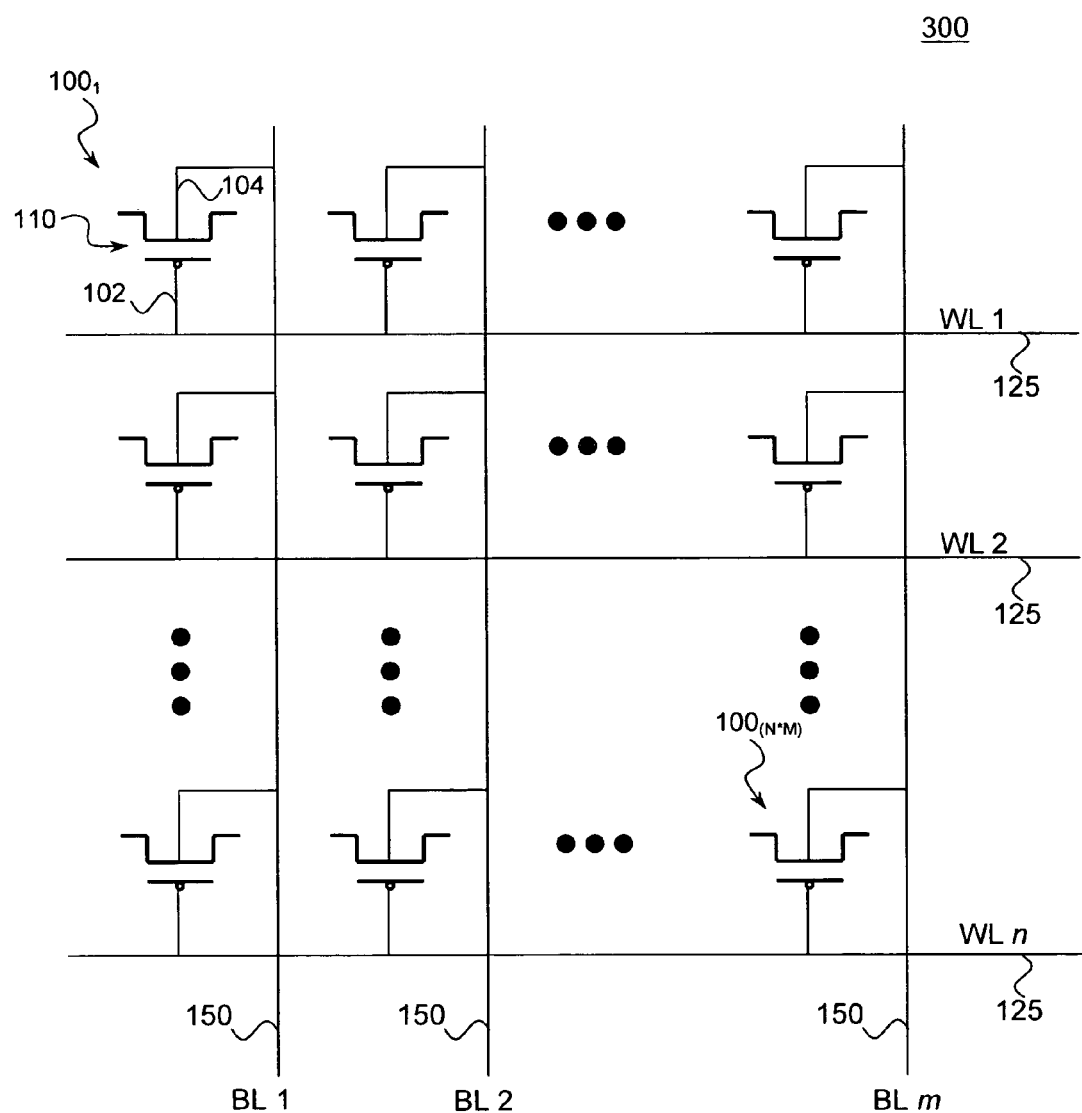
FIG. 3 illustrates a crosspoint memory array including antifuse elements in accordance with one embodiment of the present invention.

FIG. 3 illustrates a crosspoint memory array including antifuse elements in accordance with one embodiment of the present invention. Crosspoint memory array 300 includes nxm memory cells, each defined between one of n row conductors (illustrated as wordlines 125) and one of m intersecting column conductors (illustrated as bitlines 150).

In one embodiment, each memory cell includes a single antifuse element 110 in the form of a MOSFET device having a gate terminal 102 coupled directly to a wordline 125, a body terminal 104 coupled directly to a bitline 150, and corresponding source and drain terminals left unconnected or floating. Although in the illustrated embodiment of FIG. 3 each memory cell 100 is shown to contain only a single cell element, in other embodiments, one or more memory cells 100 of memory array 300 may contain multiple cell elements.

In accordance with one embodiment of the present invention, memory cells 100 of crosspoint memory array 300 may be selectively programmed by application of a programming voltage to the respective row and column conductors that define the corresponding memory cell to be programmed. In one embodiment, a memory cell may be programmed by application of a first programming voltage to a gate of an associated antifuse element 110 (e.g. via a corresponding row conductor) while a second programming voltage is applied to a body of the same antifuse element 110 (e.g. via a corresponding column conductor), such that the cumulative voltage differential applied across the respective gate and body terminals (102, 104) causes a corresponding thin Oxide layer 213 to breakdown and form PN diode 220. In one embodiment, Oxide layer 213 may measure about 20 Angstroms or less and may only require a current of about 1 mA to flow between gate terminal 102 and body terminal 104 before the Oxide layer may begin to breakdown or blow. In one embodiment, the voltage necessary to cause antifuse element 110 to blow (Vhi) may be equally divided between the row conductor and column conductor defining the corresponding memory cell. However, other fractional values of Vhi may also be applied to the row and column conductors without departing from the spirit and scope of embodiments of the invention.

Because, any memory cell or combination of memory cells of crosspoint memory array 300 may be selectively programmed through the combined application of a row voltage component and a column voltage component, the use of access transistors typically required in the prior art may be obviated. As such, the silicon area required to implement the crosspoint memory array described herein in accordance with one or more embodiments of the invention may be appreciably less than the silicon area required to implement a conventional crosspoint memory array requiring access transistors. Additionally, due to the relatively small amount of current required by the antifuse element of crosspoint array 300, the use of a protection device, such as a VDNMOS transistor, is further obviated thereby resulting in smaller silicon area requirements. Furthermore, the Oxide breakdown process of antifuse elements 110 acts cumulatively. That is, if the Oxide layer of an antifuse device does not blow correctly upon a first try, further attempts to breakdown the Oxide layer may be made through re-application of the programming voltage. This may in turn limit the need for redundant memory elements otherwise required by conventional polysilicon fuse devices.

Figure 4:
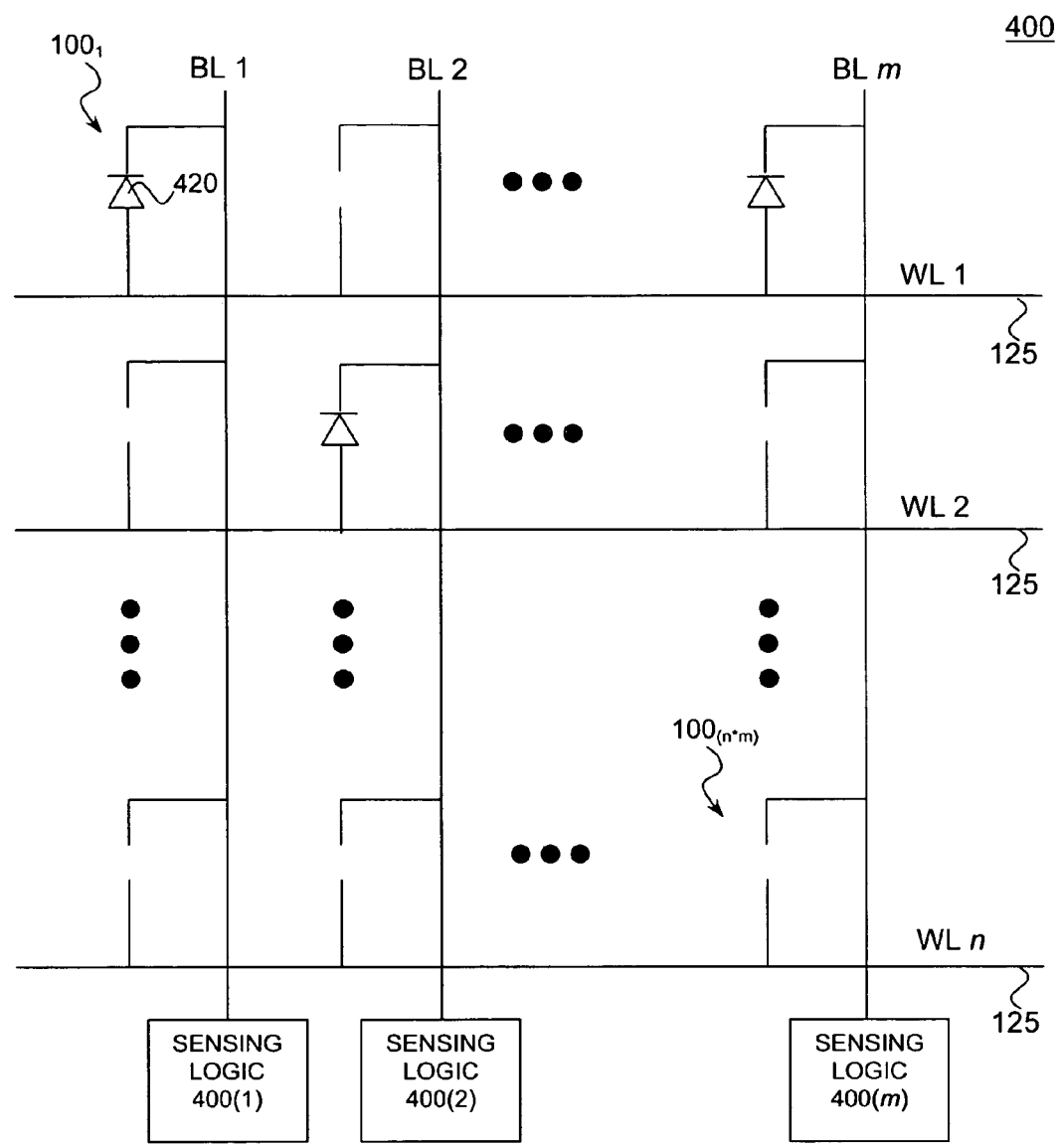
FIG. 4 illustrates a representation of a programmed crosspoint memory array in accordance with one embodiment of the present invention.

FIG. 4 illustrates a representation of a programmed crosspoint memory array in accordance with one embodiment of the present invention. As with crosspoint memory array 300, crosspoint memory array 400 similarly includes nxm memory cells 100 defined between wordlines (1-$n$) and intersecting bitlines (1-$m$). In accordance with one embodiment of the invention, antifuse elements that have been blown are represented by a diode 420 and may typically be considered as a "1" stored bit, whereas antifuse elements that have not been blown are represented by an open circuit and would typically be considered a "0" stored bit.

In one embodiment, memory cells 100 may be individually sensed to determine whether a given memory cell is programmed or not. Since, in accordance with one embodiment, a programmed memory cell may function as if a diode 420 were coupled between the corresponding wordline and bitline, sensing logic **400(1-*m*) may be provided to sense the diode turn on current. More specifically, because diode 420** which corresponds to a blown antifuse element will conduct current in a single direction (e.g. from the gate through the body), the bitline corresponding to the sensed memory cell can be programmed to detect transitions from the preconditioned low logic level to a high logic level. In one embodiment, the programming state of a subject memory cell may be sensed by pre-conditioning the bitline associated with the memory cell to a low logic value while the remaining bitlines of the memory array are set to a high logic value. The associated wordline may then be transitioned from a low logic level to a high logic level while the remaining wordlines of the memory array are set to a low logic level.

Figure 5:
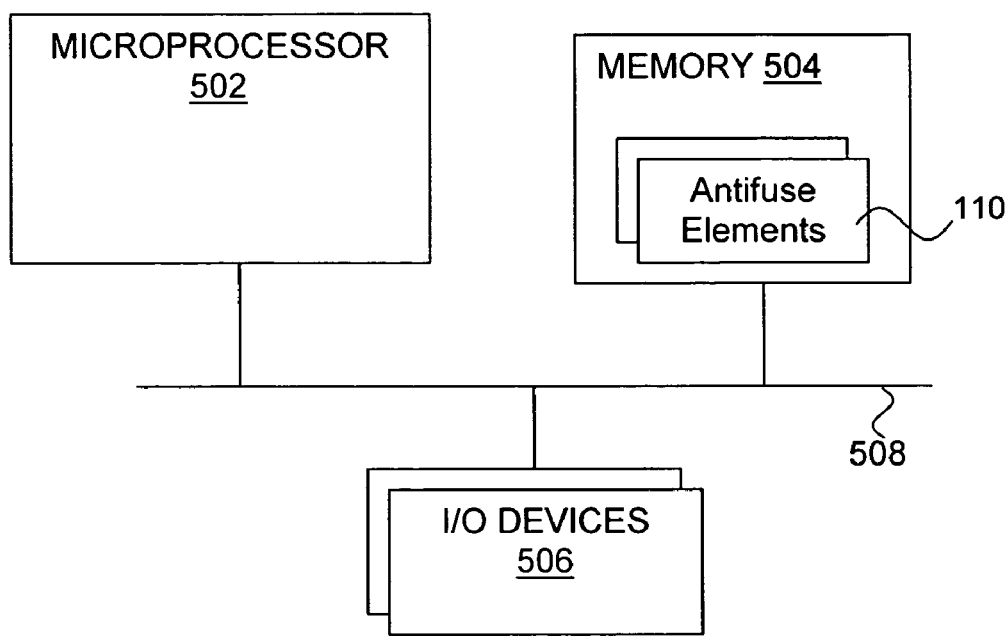
FIG. 5 illustrates an example system in accordance with one embodiment of the present invention.

FIG. 5 illustrates an example system in accordance with one embodiment of the present invention. As illustrated, example system 500 includes microprocessor 502, memory 504 advantageously incorporated with antifuse devices 110, and a number of I/O devices 506, coupled to each other and microprocessor 502 via bus 508.

Except for the advantageous incorporation of antifuse devices 110 within memory 504, elements 502, 506 and 508 represent a broad range of these elements known in the art or to be designed. In particular, examples of I/O devices 506 include but are not limited to keyboard, pointing devices, display, mass storage, communication interfaces (both wire line based or wireless), and so forth.

Depending on the applications, system 500 may include other components, including but are not limited to non-volatile memory, mass storage (such as hard disk, compact disk (CD), digital versatile disk (DVD) and so forth), graphical or mathematic co-processors, and so forth.

In various embodiments, example system 500 may be a server, a desktop computer, a laptop computer, a tablet computer, a hand held computing device, and so forth. In other embodiments, example system 500 may be a set-top box, a CD player, a DVD player, a digital camera, a digital camcorder, a wireless mobile phone, and so forth.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein.

What is claimed is:

1. A crosspoint memory array comprising:
   one or more row conductors extending in a first direction;
   one or more column conductors extending in a second direction so as to intersect the one or more row conductors; and
   an anti-fuse device coupled between a crosspoint formed between a first row conductor and a first column conductor, the anti-fuse device having a gate terminal coupled directly to the first row conductor and a body terminal coupled directly to the first column conductor.

2. The crosspoint memory array of claim 1, further comprising a second anti-fuse device having a second gate and a second body, the second anti-fuse device coupled directly to the row conductor at the second gate and coupled directly to a second column conductor at the second body.

3. The crosspoint memory array of claim 2, a third anti-fuse device having a third gate and a third body, the third anti-fuse device coupled to a second row conductor at the third gate and coupled to one of the first and second column conductors at the third body.

4. The crosspoint memory array of claim 3, wherein the one or more row conductors comprise wordlines and the one or more column conductors comprise bitlines.

5. The crosspoint memory array of claim 1, further comprising:
   a second anti-fuse device having a second gate and a second body, the second anti-fuse device coupled to the column conductor at the second gate and coupled to a second row conductor at the second body.

6. The crosspoint memory array of claim 5, wherein the anti-fuse device comprises a metal oxide semiconductor field effect transistor.

7. The crosspoint memory array of claim 1, wherein the anti-fuse device comprises a metal oxide semiconductor field effect transistor having a floating source and a floating drain.

8. The crosspoint memory array of claim 7, wherein the metal oxide semiconductor field effect transistor further comprises a dielectric layer disposed between the gate and the body such that the dielectric layer breaks down upon application of a voltage differential between the gate and the body.

9. The crosspoint memory array of claim 7, wherein the anti-fuse device operates to store a first binary value before the dielectric layer breaks down and the anti-fuse device operates to store a second opposite binary value after the dielectric layer breaks down.

10. The crosspoint memory array of claim 7, wherein the metal oxide semiconductor field effect transistor comprises a p-type metal oxide semiconductor field effect transistor.

11. The crosspoint memory array of claim 10, wherein the bitline is coupled to an N-well of the device.

12. A system comprising:
   a bus;
   a network interface coupled to the bus;
   a processor coupled to the bus; and
   a memory array coupled to the processor, the memory array including
      one or more row conductors extending in a first direction,
      one or more column conductors extending in a second direction so as to intersect the one or more row conductors, and
      an anti-fuse device coupled between a crosspoint formed between a first row conductor and a first column conductor, the anti-fuse device having a gate terminal coupled directly to the first row conductor and a body terminal coupled directly to the first column conductor.

13. The system of claim 12, wherein the memory array is disposed within the processor.

14. The system of claim 12, wherein the memory array is coupled to the bus.

15. The system of claim 12, wherein the one or more row conductors comprise wordlines and the one or more column conductors comprise bitlines.

16. The system of claim 12, wherein the anti-fuse device comprises a metal oxide semiconductor field effect transistor.

17. A method of programming a crosspoint memory array including one or more row conductors and one or more column conductors, the method comprising:
   applying a first programming voltage to a gate of an anti-fuse device coupled directly to a row conductor of the memory array; and
   applying a second programming voltage to a body of the anti-fuse device via a column conductor of the memory array;
   the first and second programming voltages selected such that a voltage differential between the gate and the body is sufficient to breakdown a dielectric layer disposed between the gate and the body of the anti-fuse device.

18. The method of claim 17, wherein the anti-fuse device comprises a metal oxide semiconductor field effect transistor having a floating source and a floating drain.

19. The method of claim 18, wherein the anti-fuse device further comprises a p-type metal oxide semiconductor field effect transistor.

20. The method of claim 17, further comprising:
   preconditioning the column conductor to a logic low state;
   transitioning the row conductor from a logic low state to a logic high state; and
   sensing on the column conductor a change in current indicating a breakdown of the dielectric layer.

21. The method of claim 20, wherein the column conductor comprises a bitline and the row conductor comprises a wordline.

* * * * *